United States Patent
Inoue (10) Patent No.: US 7,265,982 B2
(45) Date of Patent: Sep. 4, 2007

(54) SEMICONDUCTOR DEVICE (75) Inventor: Naoyuki Inoue, Ibo-Gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 56 days.

(21) Appl. No.: 11/181,987

(22) Filed: Jul. 15, 2005

(65) Prior Publication Data

US 2006/0061971 A1 Mar. 23, 2006

(30) Foreign Application Priority Data

Sep. 21, 2004 (JP) .............................. 2004-273827

(51) Int. Cl.
 *H05K 7/20* (2006.01)
 *H01L 23/28* (2006.01)
 *B32B 7/14* (2006.01)
 *B65C 11/04* (2006.01)

(52) U.S. Cl. ..................... 361/718; 174/521; 156/291; 156/295; 156/578

(58) Field of Classification Search ........ 361/679–689, 361/717–718; 438/427–429; 257/117, 304; 174/521–525, 539; 156/290–291, 295, 578
See application file for complete search history.

(56) References Cited

U.S. PATENT DOCUMENTS

| | | | | |
|---|---|---|---|---|
| 4,699,575 A | * | 10/1987 | Geisel et al. | 418/104 |
| 4,787,332 A | * | 11/1988 | Geisel et al. | 118/692 |
| 4,842,162 A | * | 6/1989 | Merkel | 222/1 |
| 5,625,536 A | * | 4/1997 | Soyano et al. | 361/736 |
| 5,920,119 A | * | 7/1999 | Tamba et al. | 257/718 |
| 5,979,794 A | * | 11/1999 | DeFillipi et al. | 239/135 |
| 6,017,485 A | * | 1/2000 | Enck et al. | 264/618 |
| 6,261,703 B1 | * | 7/2001 | Sasaki et al. | 428/627 |
| 6,521,983 B1 | * | 2/2003 | Yoshimatsu et al. | 257/678 |
| 6,563,211 B2 | * | 5/2003 | Fukada et al. | 257/706 |
| 6,774,465 B2 | * | 8/2004 | Lee et al. | 257/671 |
| 6,823,915 B2 | * | 11/2004 | Schwarzbauer | 156/349 |
| 6,995,461 B2 | * | 2/2006 | Soyano et al. | 257/678 |
| 2003/0016502 A1 | * | 1/2003 | Yamada et al. | 361/705 |
| 2004/0174682 A1 | * | 9/2004 | Lin et al. | 361/705 |
| 2005/0242341 A1 | * | 11/2005 | Knudson et al. | 257/40 |

FOREIGN PATENT DOCUMENTS

| | | |
|---|---|---|
| JP | 7-130916 | 5/1995 |
| JP | 8-162572 | 6/1996 |
| JP | 11-307658 | 11/1999 |

* cited by examiner

Primary Examiner—Jayprakash Gandhi
Assistant Examiner—Robert J. Hoffberg
(74) Attorney, Agent, or Firm—Oblon, Spivak, McClelland, Maier & Neustadt, P.C.

(57) ABSTRACT

A semiconductor device according to an embodiment of the present invention comprises a packaging substrate mounted with semiconductor chips; a heat dissipation metal plate having three or more sides and mounted with the packaging substrates; a frame provided along an external periphery of the heat dissipation metal plate and encircling the packaging substrates; an adhesive provided to between the heat dissipation metal plate and the frame to bond the heat dissipation metal plate and the frame together; and a sealing resin sealing the semiconductor chips and the packaging substrates within a box formed by the heat dissipation metal plate and the frame, wherein the volume of the adhesive at corners of the heat dissipation metal plate is smaller than that on the sides thereof.

20 Claims, 7 Drawing Sheets

SEMICONDUCTOR DEVICE

CROSS-REFERENCE TO RELATED APPLICATIONS

This application is based upon and claims the benefit of priority from the prior Japanese Patent Applications No. 2004-273827, filed on Sep. 21, 2004, the entire contents of which are incorporated herein by reference.

BACKGROUND OF THE INVENTION

1. Field of the Invention

The present invention relates to a semiconductor device, and relates, for example, to a module semiconductor device mounted with plural semiconductor elements.

2. Background Art

A module semiconductor device includes a heat dissipation metal plate fixed with a packaging substrate mounted with a semiconductor chip, and a frame as an envelope provided along an external periphery of the heat dissipation plate, and is sealed with a sealing resin. The frame is adhered to the heat dissipation metal plate along its external periphery with an adhesive.

As described in Japanese Patent Application Laid-open Publication No. H11-307658, when the frame is fixed to the heat dissipation metal plate, the adhesive overflows to the packaging substrate in some cases. The adhesive has better conductivity and poorer insulation resistance than those of the sealing resin. Therefore, when the adhesive reaches the semiconductor chip or the packaging substrate, insulation which is essential for the specification cannot be maintained.

In particularly, the adhesive overflows extremely at the corner of the heat dissipation metal plate.

Because the adhesive overflows toward the packaging substrate, a large distance needs to be kept between the frame and the packaging substrate mounted with the semiconductor chip. Therefore, this is a barrier to the provision of a compact module semiconductor device.

SUMMARY OF THE INVENTION

A semiconductor device according to an embodiment of the present invention comprises a packaging substrate mounted with semiconductor chips; a heat dissipation metal plate having three or more sides and mounted with the packaging substrates; a frame provided along an external periphery of the heat dissipation metal plate and encircling the packaging substrates; an adhesive provided to between the heat dissipation metal plate and the frame to bond the heat dissipation metal plate and the frame together; and a sealing resin sealing the semiconductor chips and the packaging substrates within a box formed by the heat dissipation metal plate and the frame, wherein the volume of the adhesive at corners of the heat dissipation metal plate is smaller than that on the sides thereof.

A semiconductor device according to another embodiment of the present invention comprises a packaging substrate mounted with semiconductor chips; a heat dissipation metal plate having three or more sides and mounted with the packaging substrates; a frame provided along an external periphery of the heat dissipation metal plate and encircling the packaging substrates; an adhesive provided to between the heat dissipation metal plate and the frame to bond the heat dissipation metal plate and the frame together; and a sealing resin sealing the semiconductor chips and the packaging substrates within a box formed by the heat dissipation metal plate and the frame, wherein the adhesive, which is provided to corners of the heat dissipation metal plate, is provided at more external edge sides than the adhesive provided to the sides of the heat dissipation metal plate.

A semiconductor device according to further embodiment of the present invention comprises a packaging substrate mounted with semiconductor chips; a heat dissipation metal plate mounted with the packaging substrates; a frame provided along an external periphery of the heat dissipation metal plate and encircling the packaging substrates, the frame having a groove provided on an inner wall of the frame; an adhesive provided to between the heat dissipation metal plate and the frame to bond the heat dissipation metal plate and the frame together; and a sealing resin sealing the semiconductor chips and the packaging substrates within a box formed by the heat dissipation metal plate and the frame.

DETAILED DESCRIPTION OF THE INVENTION

Exemplary embodiments of the present invention will be described with reference to the drawings. The invention is not limited by the embodiments.

FIRST EMBODIMENT

Figure 1:
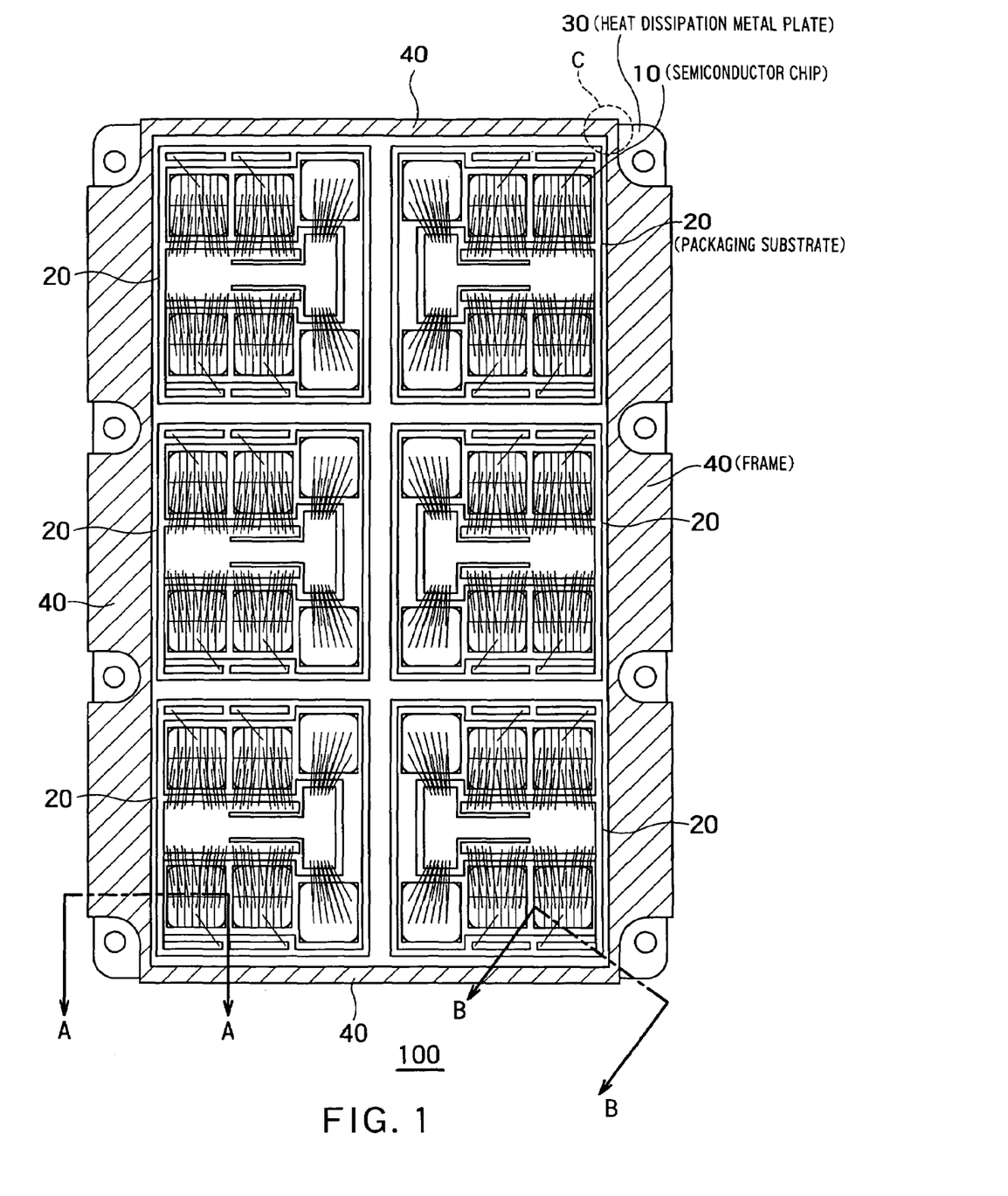
FIG. 1 is a top plan view of a semiconductor device 100 according to a first embodiment of the present invention.

FIG. 1 is a top plan view of a module semiconductor device 100 (referred to a "semiconductor device 100" hereinafter simply) according to a first embodiment of the present invention. The semiconductor device 100 is used to control a current of a motor, and has a breakdown voltage of 6 kVrms/minute or more as a representative example.

The semiconductor device 100 has semiconductor chips 10, packaging substrates 20, a heat dissipation metal plate 30 (referred to a "metal plate 30" hereinafter simply), and a frame 40. Each semiconductor chip 10 is mounted on the packaging substrate 20. The packaging substrate 20 has a metal wiring 20a printed on the front surface of an insulation plate 20b. The packaging substrate 20 is fixed to the front surface of the metal plate 30 with a metal 20c supplied to the back surface of the insulation plate 20b. The metal plate 30 is fixed by the metal 20c to increase the heat dissipation efficiency from the packaging substrate 20. The frame 40 is adhered to the front surface of the metal plate 30 with an adhesive. The frame 40 is provided along the external periphery of the metal plate 30 to surround the packaging substrates 20. With this arrangement, the metal plate 30 and the frame 40 form a box shape, with the metal plate 30 as a bottom surface, and with the frame 40 as a side wall. In order to seal the semiconductor chips 10 and the packaging substrates 20, a sealing resin 60 (refer to FIG. 2 and FIG. 3) is filled in this box. The above-mentioned breakdown voltage indicates a breakdown voltage between electrodes of the semiconductor chips 10 and the metal plate 30.

The metal plate 30 may have a polygonal plane shape having n sides (n is a positive number equal to or more than 3). Because the frame 40 is provided along the external periphery of the metal plate 30, the frame 40 also has the same polygonal shape as that of the metal plate 30. According to the present embodiment, the metal plate 30 has approximately a rectangle, and the frame 40 is an approximately rectangular frame, as shown in FIG. 1. The metal plate 30 can be made of copper or an MMC (i.e., metal matrix composite material). The frame 40 can be made of a highly insulating silicon resin. The packaging substrate 20 can be a printed circuit board having copper printed on the front surface and the back surface of an insulating plate made of ceramic. An adhesive 50 has better conductivity and poorer insulation resistance than those of the sealing resin 60 that seals the semiconductor chips 10.

The frame 40 and the metal plate 30 are adhered together with an adhesive as follows. An adhesive coating machine (i.e., an X-Y robot) coats the adhesive 50 onto the external periphery of the metal plate 30 that is mounted with the semiconductor chips 10 and others. Next, the frame 40 is mounted onto the metal plate 30, thereby pressing the metal plate 30 and the frame 40 together. As a result, the frame 40 and the metal plate 30 are adhered together with the adhesive 50. At this adhering time, the adhesive 50 overflows onto the metal plate 30 inside the frame 40. When the overflowed adhesive 50 connects between the metal wiring 20a and the metal 20c or the metal plate 30, the insulation resistance of the semiconductor device 100 is degraded, because the adhesive 50 has better conductivity and poorer insulation resistance than those of the sealing resin 60. The overflow of the adhesive 50 easily occurs particularly at the corner of the metal plate 30.

In general, the adhesive 50 is coated by a machine. The adhesive coating machine usually supplies the adhesive uniformly by relatively moving an adhesive providing opening and the metal plate 30 at an equal speed. According to this method, at four corners of the metal plate 30, a relative move direction of the providing opening and the metal plate 30 changes by 90 degrees from a X direction to an Y direction, or from the Y direction to the X direction. Because the adhesive is supplied by equal providing volume, when the frame 40 is adhered, the overflow of the adhesive from both the X direction and the Y direction is duplicated at the four corners of the metal plate 30. Therefore, according to the conventional method, the adhesive 50 is easily adhered to the packaging substrate 20 at the four corners of the metal plate 30.

Figure 4:
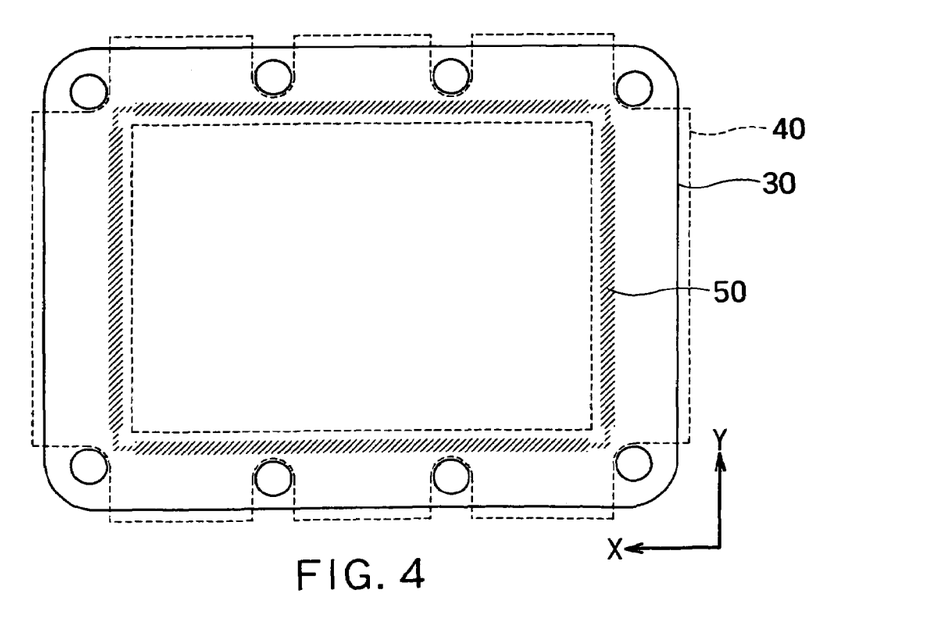
FIG. 4 is a top plan view of a semiconductor device indicating a state that the adhesive 50 is coated onto the metal plate 30 according to a first embodiment.

According to the present embodiment, the coating volume of the adhesive 50 is reduced at the corners as shown in FIG. 4. In order to reduce the coating volume of the adhesive 50 at the corners, there are several methods such as a method of increasing the speed of the adhesive coating machine at the corners, and a method of lowering the coating pressure of the adhesive coating machine at the corners.

Figure 2:
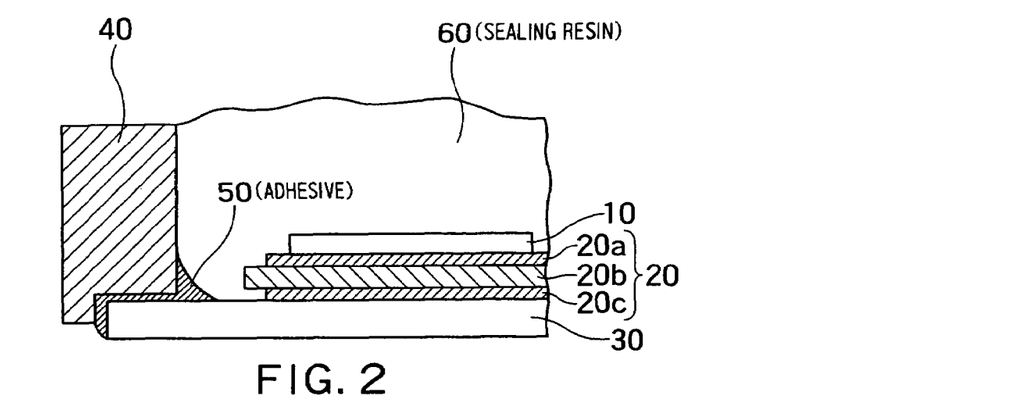
FIG. 2 is a cross-sectional view of the semiconductor device 100 shown in FIG. 1 taken along a line A-A.
Figure 3:
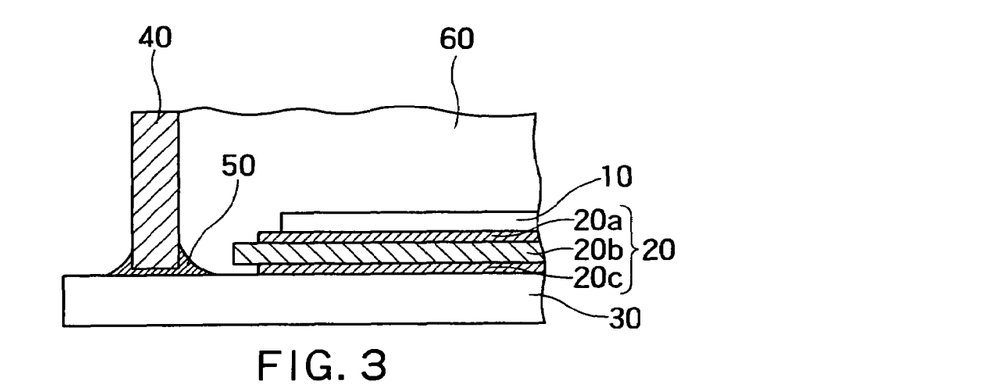
FIG. 3 is a cross-sectional view of the semiconductor device 100 shown in FIG. 1 taken along a line B-B.

FIG. 2 is a cross-sectional view of the semiconductor device 100 shown in FIG. 1 taken along a line A-A. FIG. 3 is a cross-sectional view of the semiconductor device 100 shown in FIG. 1 taken along a line B-B. In other words, FIG. 2 a cross-sectional view of a side of the metal plate 30, and FIG. 3 is a cross-sectional view of a corner of the metal plate 30. As shown in FIG. 3, according to the present embodiment, overflow volume of the adhesive 50 at the four corners of the metal plate 30 is smaller than that according to the conventional practice.

In FIG. 3, a state of coating the adhesive 50 according the first embodiment is shown. According to the present embodiment, the providing volume of the adhesive 50 at the four corners of the metal plate 30 is smaller than the providing volume of the adhesive on each side of the metal plate 30. In order to reduce the providing volume of the adhesive 50 at the four corners of the metal plate 30, the providing opening and the metal plate 30 are relatively moved at a constant speed, and the providing volume of the adhesive is decreased at only the four corners of the metal plate 30. Alternatively, the adhesive is provided by equal volume, and the relative speed of the providing opening and the metal plate 30 is increased at only the four corners. With this arrangement, the overflow of the adhesive at the corners of the metal plate 30 decreases, and the adhesive 50 does not easily reach the semiconductor chip 10 and the packaging substrate 20 (refer to FIG. 3).

Because the adhesive 50 does not easily overflow to the inside of the frame 40 based on the above methods, a distance between the semiconductor chips 10 and the frame 40 and a distance between the packaging substrate 20 and the frame 40 can be made smaller respectively. As a result, the semiconductor device 100 can be made compact.

As explained above, according to the present embodiment, because the coating volume of the adhesive 50 at the four corners of the metal plate 30 is small, the volume of the adhesive 50 that overflows at the four corners of the metal plate 30 is minimized. Therefore, the adhesive 50 does not easily adhere to the packaging substrate 20 at the four corners of the metal plate 30. Consequently, the semiconductor device 100 according to the present embodiment can maintain high insulation resistance even when provided in compact.

SECOND EMBODIMENT

Figure 5:
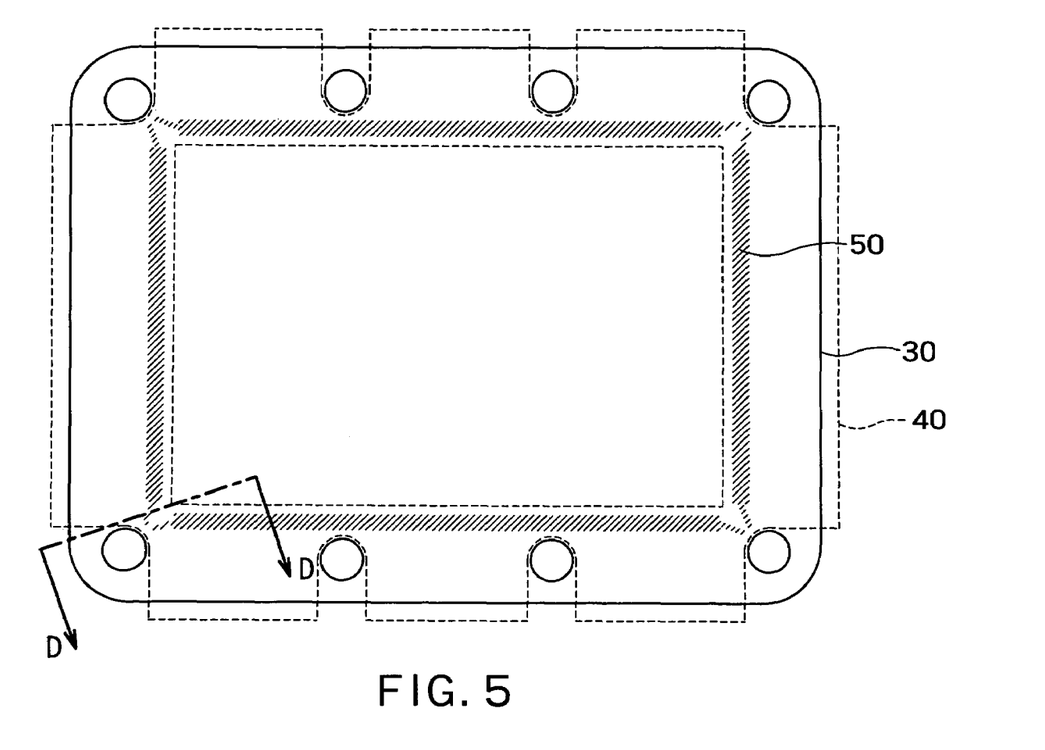
FIG. 5 is a top plan view of a semiconductor device indicating a state that the adhesive 50 is coated onto the metal plate 30 according to a second embodiment.

FIG. 5 is a top plan view of a semiconductor device indicating a state that the adhesive 50 is coated onto the metal plate 30 according to a second embodiment. According to the second embodiment, the adhesive that is provided to the four corners of the metal plate 30 is provided at more external edge sides than the adhesive provided to the sides of the metal plate 30. With this arrangement, even when the adhesive 50 overflows from between the metal plate 30 and the frame 40 at the corners of the metal plate 30, the adhesive overflows toward the outside of the frame 40. The top plan view of the semiconductor device according to the second embodiment is similar to that of FIG. 1.

Figure 6:
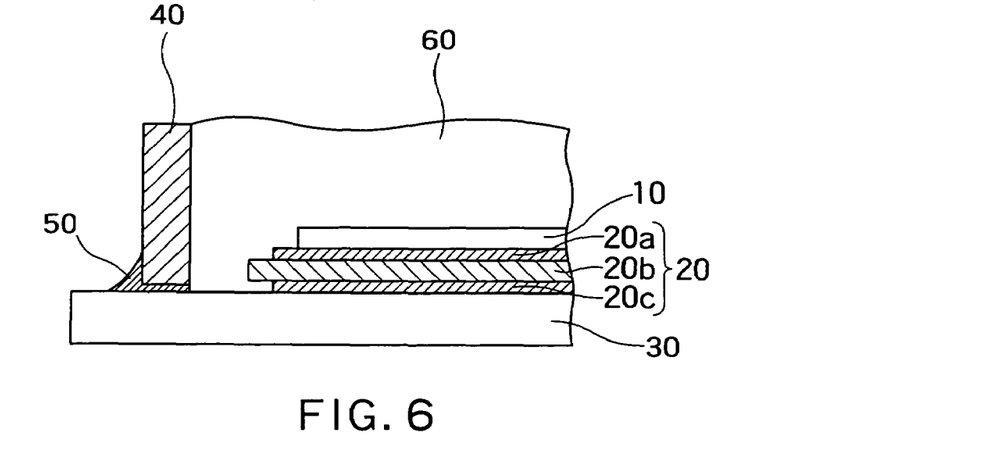
FIG. 6 is a cross-sectional view of the semiconductor device shown in FIG. 5 taken along a line D-D.

FIG. 6 is a cross-sectional view of the semiconductor device shown in FIG. 5 taken along a line D-D. A cross-sectional view of a side of the metal plate 30 is similar to that of FIG. 2, and therefore, is omitted.

As explained above, according to the present embodiment, because the adhesive 50 does not overflow to the inside at the four corners of the metal plate 30, the adhesive 50 does not adhere to the packaging substrate 20 at the four corners of the metal plate 30. As a result, the semiconductor device according to the present embodiment can maintain high insulation resistance even when provided in compact.

THIRD EMBODIMENT

Figure 7:
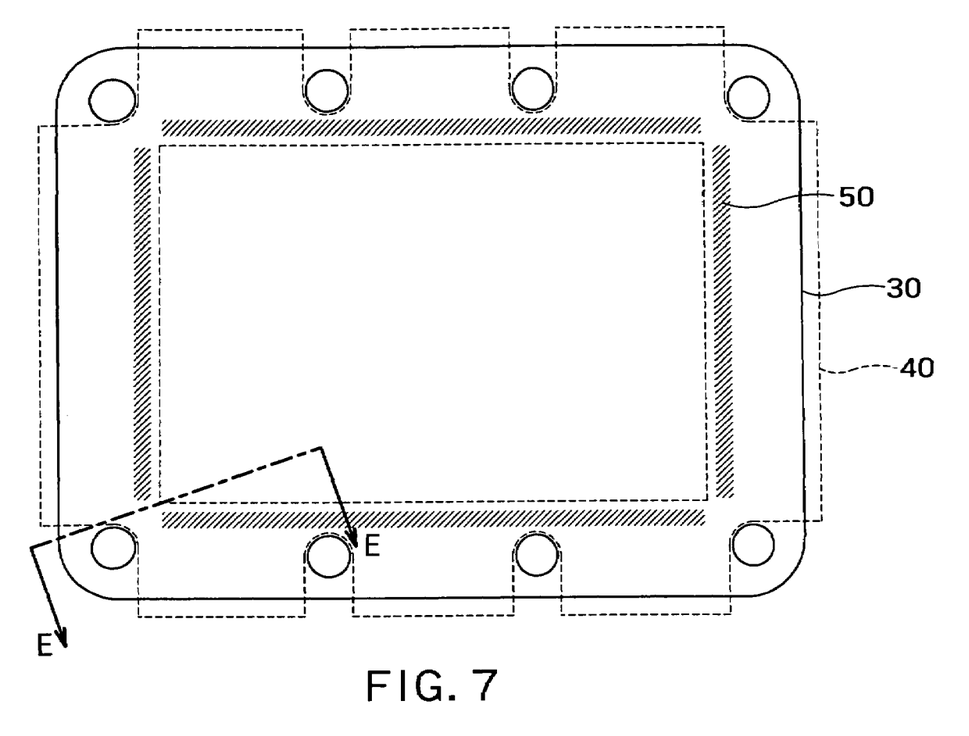
FIG. 7 is a top plan view of a semiconductor device indicating a state that the adhesive 50 is coated onto the metal plate 30 according to a third embodiment.

FIG. 7 is a top plan view of a semiconductor device indicating a state that the adhesive 50 is coated onto the metal plate 30 according to a third embodiment. According to the third embodiment, no adhesive is provided at the four corners of the metal plate 30. With this arrangement, according to the present embodiment, the adhesive 50 does not overflow at the four corners of the metal plate 30. The top plan view of the semiconductor device according to the third embodiment is similar to that of FIG. 1.

Figure 8:
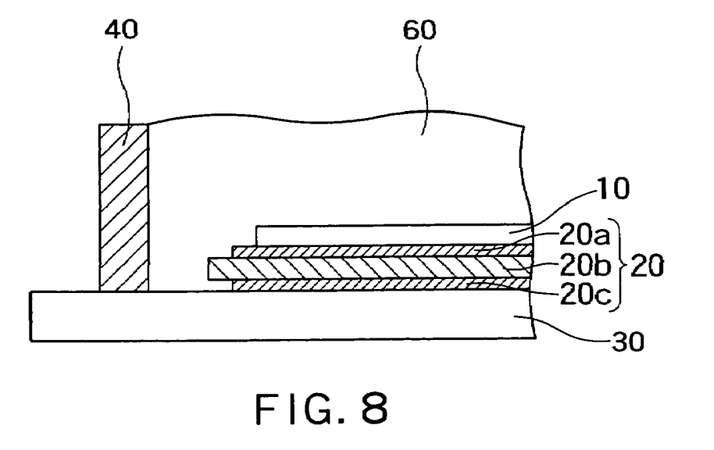
FIG. 8 is a cross-sectional view of the semiconductor device shown in FIG. 7 taken along a line E-E.

FIG. 8 is a cross-sectional view of the semiconductor device shown in FIG. 7 taken along a line E-E. A cross-sectional view of a side of the metal plate 30 is similar to that of FIG. 2, and therefore, is omitted. As explained above, according to the present embodiment, because the adhesive 50 does not overflow at the four corners of the metal plate 30, the adhesive 50 does not adhere to the packaging substrate 20. As a result, the semiconductor device according to the present embodiment can maintain high insulation resistance even when provided in compact.

FOURTH EMBODIMENT

Figure 9:
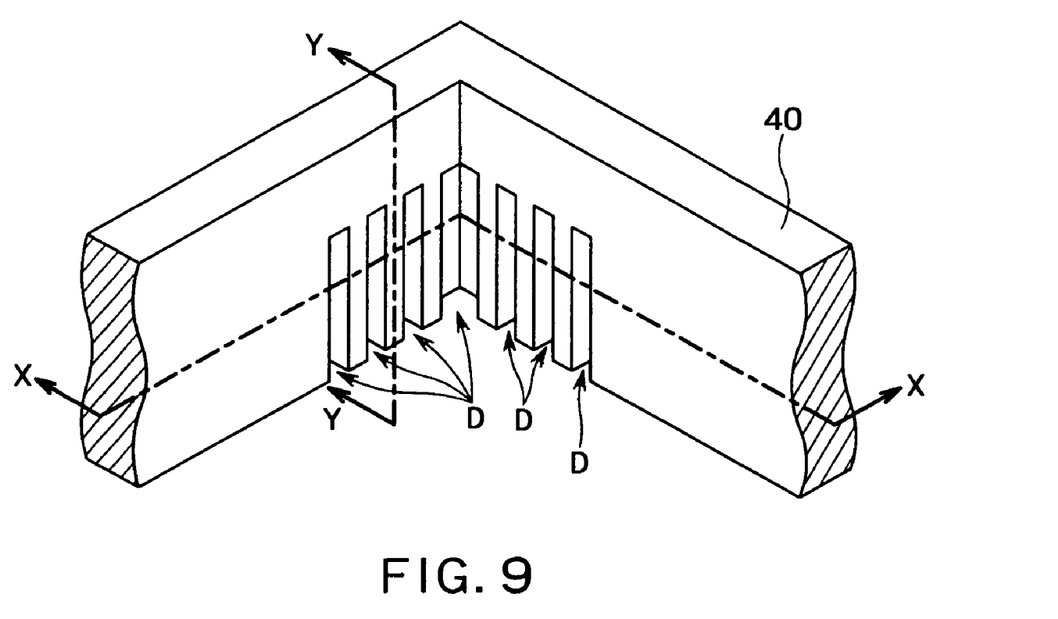
FIG. 9 is a perspective view of a corner C of the frame 40 that is used for a semiconductor device according to a fourth embodiment.

FIG. 9 is a perspective view of a corner C (refer to FIG. 1) of the frame 40 that is used for a semiconductor device according to a fourth embodiment of the present invention. According to the fourth embodiment, grooves D are provided on the inner wall of the corners and near their places of the frame 40. One end of each groove D is open, and the other end is closed in the middle of the inner wall of the frame 40. The metal plate 30 faces the open ends of the grooves D. Constituent elements other than the frame 40 may be similar to those according to the above embodiments.

When the metal plate 30 and the frame 40 are adhered together, the adhesive 50 overflows to the inside of the frame 40. The overflowed adhesive 50 remains on the inner wall after flowing through the grooves formed on the inner wall of the frame 40. Therefore, the adhesive 50 does not easily spread toward the semiconductor chip 10 along the metal plate 30.

Each groove D has a width capable of absorbing the adhesive that bonds between the metal plate 30 and the frame 40, based on a capillary phenomenon. With this arrangement, the grooves D can absorb surplus adhesive provided to the four corners of the metal plate 30. Therefore, the adhesive does not overflow at the four corners of the metal plate 30. According to the present embodiment, because the adhesive 50 does not overflow at the corners of the metal plate 30, the adhesive 50 does not adhere to the packaging substrate 20. As a result, the semiconductor device according to the present embodiment can maintain high breakdown voltage even when provided in compact.

Figure 10:
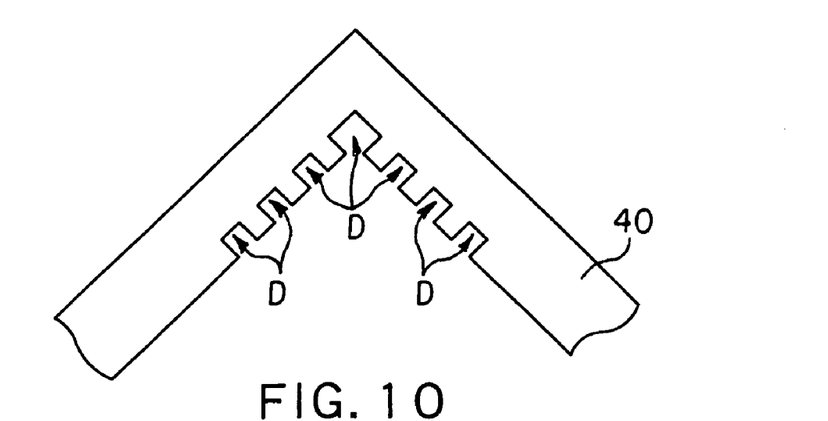
FIG. 10 is a cross-sectional view of the flame 40 having a groove D which is shaped a square-form.
Figure 11:
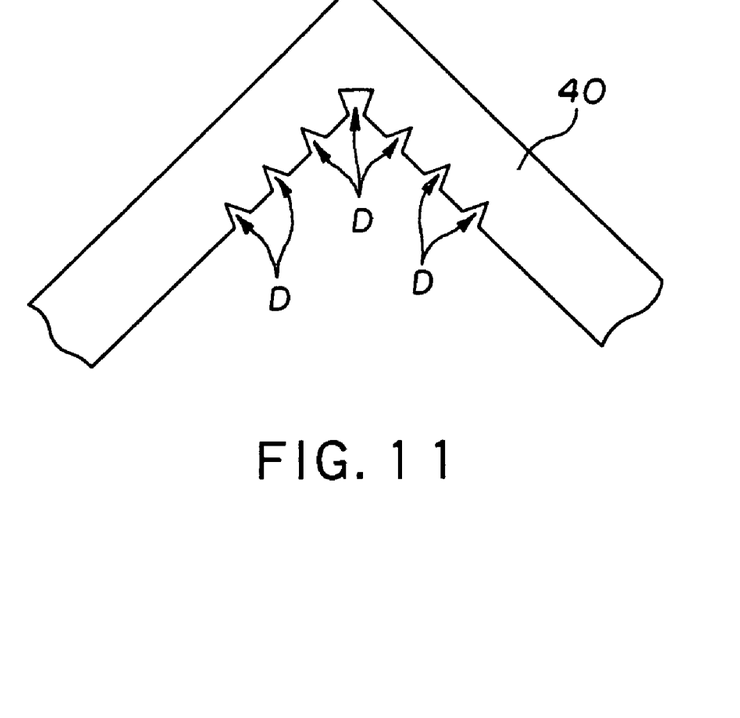
FIG. 11 is a cross-sectional view of the flame 40 having a groove D which is shaped a triangular-form.
Figure 12:
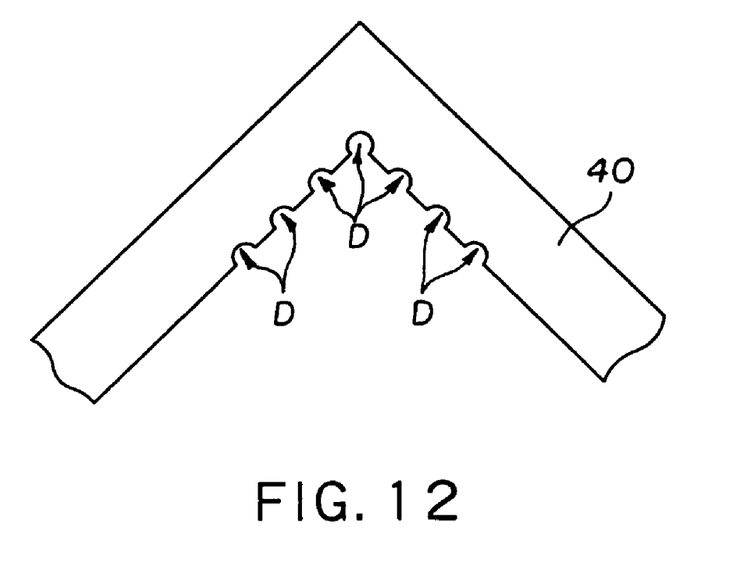
FIG. 12 is a cross-sectional view of the flame 40 having a groove D which is shaped a semicircular-form.

The length of each groove D is not particularly specified. A cross-sectional shape of the groove D is not particularly specified either. For example, a cross-sectional diagram obtained by cutting the grooves D along a line X-X of FIG. 9 can be any one of FIG. 10 to FIG. 12. In FIG. 10, each groove D has a square cross section. In FIG. 11, each groove D has a triangular (i.e., V-shaped) cross section. In FIG. 12, each groove D has a semicircular cross section. When each groove D has any one of these shapes, the effect of the present embodiment is not lost.

According to the present embodiment, while the groove D is linearly formed in a height direction, the adhesive 50 can be left on the inner wall of the frame 40 when the groove D has a square shape or a free curvature.

Figure 13:
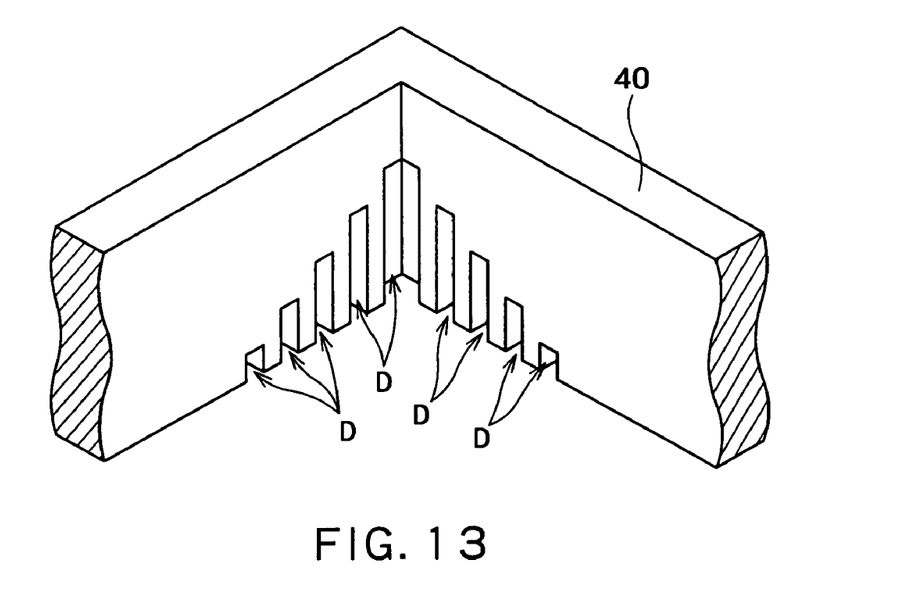
FIG. 13 is a perspective view of the corner C of the frame 40 according to a modification of the fourth embodiment.

FIG. 13 is a perspective view of the corner C (refer to FIG. 1) of the frame 40 according to a modification of the fourth embodiment. According to this modification, the grooves D at the corners of the frame 40 have relatively larger lengths, and the grooves D far from the corners have relatively smaller lengths. When the grooves at the corners have larger lengths, the adhesive 50 can easily remain on the inner wall at the corners of the frame 40 where the coated volume is large. Further, the volume of the adhesive 50 that overflows toward the semiconductor chip 10 can be reduced. Constituent elements other than the grooves of the modification are similar to those according to the fourth embodiment.

Because the grooves D can absorb surplus adhesive provided to the four corners of the metal plate 30, the present modification has the effect similar to that obtained according to the fourth embodiment. The grooves D with a distance from the corners of the frame 40 have smaller lengths. Therefore, according to the present modification, degradation in the strength of the frame 40 and distortion of the frame 40 can be relatively minimized.

According to the present embodiment, while the bottom ends of the grooves D are opened and are brought into contact with the metal plate 30, the bottom ends of the grooves D need not be open. A distance between the bottom end of each groove D and the metal plate 30 can be the distance that allows the adhesive 50 to reach the bottom end of the groove D when the frame 40 and the metal plate 30 are adhered together.

Figure 14:
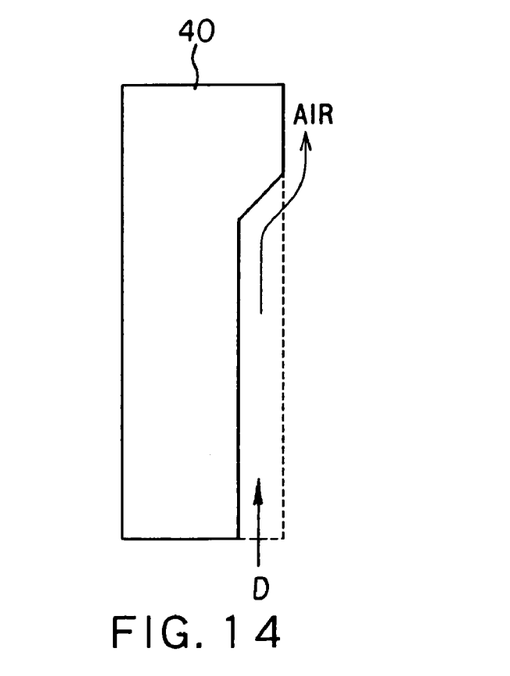
FIG. 14 is a cross-sectional view of a groove D which has a taper at the top end of the groove D.

As shown in FIG. 14, according to the fourth embodiment, the top end of the groove D can be tapered so that the opening area of the groove D expands toward an inner side of the frame 40. With this arrangement, when the groove D absorbs the adhesive, air can be easily discharged to the outside from the inside of the groove D, and the adhesive 50 can easily remain on the inner wall of the frame 40. Based on the taper, the sealing resin 60 can be easily filled in the grooves on the inner wall of the frame 40.

According to the fourth embodiment, while the rectangular metal plate and the rectangular frame are used, these can be circular. When grooves are provided on the inner wall at the peripheral part of the circular frame, overflow of the adhesive at the peripheral part can be suppressed.

According to the present embodiment, the grooves are provided on the inner wall at the corners of the frame, where a large volume of the adhesive overflows according to the conventional technique. However, grooves can be formed at not only the corners of the frame but also on the inner wall of the sides of the frame. With this arrangement, overflow of the adhesive on the sides can be suppressed. When the grooves are formed on only the inner wall of the sides of the frame, overflow of the adhesive on the sides can be also suppressed.

The invention claimed is:

1. A semiconductor device comprising:
   a packaging substrate mounted with semiconductor chips;
   a heat dissipation metal plate having three or more sides and mounted with the packaging substrates;
   a frame provided along an external periphery of the heat dissipation metal plate and encircling the packaging substrates;
   an adhesive provided between the heat dissipation metal plate and the frame to bond the heat dissipation metal plate and the frame together; and
   a sealing resin sealing the semiconductor chips and the packaging substrates within a box formed by the heat dissipation metal plate and the frame, wherein
   the volume of the adhesive at corners of the heat dissipation metal plate is smaller than that on the sides thereof.

2. The semiconductor device according to claim 1, wherein
   the adhesive is not provided at corners of the heat dissipation metal plate.

3. The semiconductor device according to claim 1, wherein
   the adhesive provided to corners of the heat dissipation metal plate is provided closer to the plate edge than the adhesive provided to the sides of the heat dissipation metal plate.

4. The semiconductor device according to claim 1, wherein
   a breakdown voltage between electrodes of the semiconductor chips and the heat dissipation metal plate is 6 kVrms/minute or more.

5. A semiconductor device comprising:
   a packaging substrate mounted with semiconductor chips;
   a heat dissipation metal plate having three or more sides and mounted with the packaging substrates;
   a frame provided along an external periphery of the heat dissipation metal plate and encircling the packaging substrates;
   an adhesive provided between the heat dissipation metal plate and the frame to bond the heat dissipation metal plate and the frame together; and
   a sealing resin sealing the semiconductor chips and the packaging substrates within a box formed by the heat dissipation metal plate and the frame, wherein
   the adhesive provided to corners of the heat dissipation metal plate is provided closer to the plate edge than the adhesive provided to the sides of the heat dissipation metal plate.

6. The semiconductor device according to claim 5, wherein
   a breakdown voltage between electrodes of the semiconductor chips and the heat dissipation metal plate is 6 kVrms/minute or more.

7. A semiconductor device comprising:
   a packaging substrate mounted with semiconductor chips;
   a heat dissipation metal plate mounted with the packaging substrates;
   a frame provided along an external periphery of the heat dissipation metal plate and encircling the packaging substrates, the frame having a groove provided on an inner wall of the frame, the groove extending upward from the heat dissipation metal plate;
   an adhesive provided between the heat dissipation metal plate and the frame to bond the heat dissipation metal plate and the frame together; and
   a sealing resin sealing the semiconductor chips and the packaging substrates within a box formed by the heat dissipation metal plate and the frame.

8. The semiconductor device according to claim 7, wherein
   one end of the groove is open and faces a surface of the heat dissipation metal plate.

9. The semiconductor device according to claim 8, wherein
   the heat dissipation metal plate is formed in a polygonal shape which has three or more sides;
   wherein the frame is formed in a polygonal shape to encircle the packaging substrate and has a plurality of grooves, the grooves being provided on an inner wall of corners of the frame and on an inner wall near the corners.

10. The semiconductor device according to claim 9, wherein
    the grooves at the corners of the frame have relatively larger lengths, and the grooves far from the corners have relatively smaller lengths.

11. The semiconductor device according to claim 8, wherein
    the groove is formed to absorb the adhesive by a capillary phenomenon.

12. The semiconductor device according to claim 8, wherein
    the top end of the groove is tapered and expands toward an inner side of the frame.

13. The semiconductor device according to claim 8, wherein
    the heat dissipation metal plate is formed in a quadrangular shape;
    wherein the frame is formed in a quadrangular shape to encircle the packaging substrate and has a plurality of grooves, the grooves being provided on an inner wall of corners of the frame and on an inner wall near the corners.

14. The semiconductor device according to claim 7, wherein
    the heat dissipation metal plate is formed in a polygonal shape which has three or more sides;
    wherein the frame is formed in a polygonal shape to encircle the packaging substrate and has a plurality of grooves, the grooves being provided on an inner wall of corners of the frame and on an inner wall near the corners.

15. The semiconductor device according to claim 14, wherein
    the grooves at the corners of the frame have relatively larger lengths, and the grooves far from the corners have relatively smaller lengths.

16. The semiconductor device according to claim 14, wherein
    the groove is formed to absorb the adhesive by a capillary phenomenon.

17. The semiconductor device according to claim 7, wherein
    the groove is formed to absorb the adhesive by a capillary phenomenon.

18. The semiconductor device according to claim 7, wherein
the top end of the groove is tapered and expands toward an inner side of the frame.

19. The semiconductor device according to claim 7, wherein
the heat dissipation metal plate is formed in a quadrangular shape;
wherein the frame is formed in a quadrangular shape to encircle the packaging substrate and has a plurality of grooves, the grooves being provided on an inner wall of corners of the frame and on an inner wall near the corners.

20. The semiconductor device according to claim 7, wherein
a breakdown voltage between electrodes of the semiconductor chips and the heat dissipation metal plate is 6 kVrms/minute or more.

* * * * *